(12) United States Patent
Laig-Hörstebrock et al.

(10) Patent No.: US 6,268,712 B1
(45) Date of Patent: Jul. 31, 2001

(54) METHOD FOR DETERMINING THE STARTING ABILITY OF A STARTER BATTERY IN A MOTOR VEHICLE

(75) Inventors: Helmut Laig-Hörstebrock, Frankfurt; Eberhard Meissner, Hofheim, both of (DE)

(73) Assignee: VB Autobatterie GmbH (DE)

( * ) Notice: Subject to any disclaimer, the term of this patent is extended or adjusted under 35 U.S.C. 154(b) by 0 days.

(21) Appl. No.: 09/669,275

(22) Filed: Sep. 26, 2000

(51) Int. Cl.[7] ............................. H02J 7/00; G01N 27/416
(52) U.S. Cl. ......................... 320/132; 320/136; 324/432; 324/433
(58) Field of Search ..................... 320/132, 136, 320/DIG. 22; 324/427, 430, 432, 433

(56) References Cited

U.S. PATENT DOCUMENTS

| | | | |
|---|---|---|---|
| 5,598,088 | * | 1/1997 | Richter ................................. 320/134 |
| 5,818,333 | * | 10/1998 | Yaffe et al. ........................... 340/455 |
| 6,118,252 | * | 9/2000 | Richter ................................. 320/132 |
| 6,163,133 | * | 12/2000 | Laig-Horstebrock et al. ....... 320/132 |

FOREIGN PATENT DOCUMENTS

| | | |
|---|---|---|
| 37 12 629 C2 | 10/1987 | (DE) . |
| 39 01 680 C2 | 3/1990 | (DE) . |
| 197 50 309 A1 | 5/1999 | (DE) . |
| 198 47 648 A1 | 4/2000 | (DE) . |
| WO 99/17128 | 4/1999 | (WO) . |

* cited by examiner

Primary Examiner—Peter S. Wong
Assistant Examiner—Gregory J. Toatley, Jr.
(74) Attorney, Agent, or Firm—Schnader Harrison Segal & Lewis LLP

(57) ABSTRACT

A method for determining the starting ability of the starter battery in a motor vehicle. The current and voltage of the storage battery are measured before starting is begun, shortly after starting is begun and at short intervals of time during the starting procedure. The current/voltage value pairs for each instant are used to calculate a resistance value and the quantity of charge drawn from the storage battery, and the rate of rise in the resistance values as a function of the quantity of charge drawn is used to derive a measure of the availability of the storage battery during the starting procedure. In particular, the gradient $\Delta RQ$ of the internal resistance as a function of the quantity of charge drawn and the turn-on internal resistance $R_E$ are stored in an arithmetical memory as a field as a function of the charge state or of the equivalent no-load voltage ($U_R$) and the battery temperature and are compared with already recorded values or typical normal values.

9 Claims, 3 Drawing Sheets

METHOD FOR DETERMINING THE STARTING ABILITY OF A STARTER BATTERY IN A MOTOR VEHICLE

FIELD OF THE INVENTION

This invention relates to a method for determining the starting ability of the starter battery in a motor vehicle.

BACKGROUND

Of crucial importance for the ability of a starter battery to start a motor vehicle having an internal combustion engine are the charge state and the advancement of aging or the decline in capacitance, because these limit the current strength which can be drawn from the starter battery, or the power output thereof. Starting the engine is amongst the heaviest demands on the battery in the motor vehicle. The starting procedure is when it is most noticeable if the performance of a battery is reduced by aging.

The reduction in the loading capacity of a battery over relatively long periods of time is caused, on the one hand, by the rise in the nonreactive internal resistance of the battery, and, on the other hand, by passivation phenomena on the active materials.

In a modern motor vehicle, the properties of the generator, the battery and the electrical loads are matched to one another such that only an instance of several mishandling can result in battery charge states being so low that the starting ability is no longer assured. The request for a reliable indicator for battery replacement is, therefore, of great importance, particularly when safety-related electrical loads are installed, such as electric brakes or electrically assisted steering aids.

DE-C 3901680 discloses a method for monitoring the cold starting ability of the starter battery for an internal combustion engine, in which the time profile of the voltage drop which occurs on starting is observed and evaluated. The evaluation is carried out on the basis of maximum ratings for a characteristic curve obtained from empirical values, and on the basis of the battery temperature.

DE-C 3712629 describes a measuring device for the remaining useful life of a motor vehicle battery which records the battery voltage and the associated load current value before and after starting for the first time with the battery in the fully charged state, ascertains the temperature-compensated internal resistance, stores it in a memory and compares it with the internal resistance values ascertained for subsequent starting procedures in the internal combustion engine. An indication is then given on the basis of prescribed stored threshold values.

DE-A 1 19750309 discloses a method for determining the starting ability of the starter battery in a motor vehicle, in which the voltage dip on starting is recorded and stored taking into account the temperature of the battery and the engine. The increase in the size of the voltage dip, associated with aging of the battery, as compared with the fresh values is used as a measure of battery aging.

WO 99/17128 discloses the practice of comparing, during the starting procedure, the voltage values of adjacent voltage minima arising on account of the compression and decompression of the engine pistons. The difference between these values is used as a measure for indicating the battery state.

Thus, it would be highly advantageous to provide a method for determining tie starting ability or the availability of a storage battery used for starting an internal combustion engine, wherein the method reliably ascertains the state of the battery.

SUMMARY OF THE INVENTION

Thus, the invention embodies a method for determining the starting ability of a starter battery in a motor vehicle including measuring current and voltage of the storage battery before starting is begun; measuring current and voltage of the storage battery shortly after starting is begun; measuring current and voltage of the storage battery at predetermined intervals of time during starting; calculating a resistance value and the quantity of charge drawn from the storage battery from current/voltage value pairs for each measurement; and determining a measure of availability of the storage battery during starting based on the rate of rise in the resistance values as a function of the quantity of charge drawn.

BRIEF DESCRIPTION OF THE DRAWINGS

The subject matter of the invention is explained in more detail below with the aid of the Figures.

DETAILED DESCRIPTION OF THE INVENTION

According to the invention, the current and voltage of the storage battery are measured before starting is begun, shortly after starting is begun and at short intervals of during the starting procedure. The current/voltage value pairs are used to calculate, for each instant, a resistance value and the quantity of charge drawn from the storage battery after starting begins. The rate of rise in the storage battery internal resistance as a function of the charge drawn is used to determine a measure of the availability of the storage battery for the starting procedure.

In the case of the invention method for determining the starting ability or the availability of a storage battery used for starting an internal combustion engine, the two essential causes of battery aging are clearly distinguished: the purely nonreactive turn-on resistance and the resistances which additionally build up during starting over time. Since each resistance component can independently impede the starting procedure, different boundary conditions also apply for each one. The two resistances taken together provide a comprehensive description of the starting ability of a battery.

In addition, the charge state and the battery temperature can be taken into account. By way of example, the charge state can be estimated from the no-load voltage measured before starting. A method for estimating the charge state from the no-load voltage is described in prior German Patent Application 198 47 648, the subject matter of which is incorporated by reference.

Figure 1:
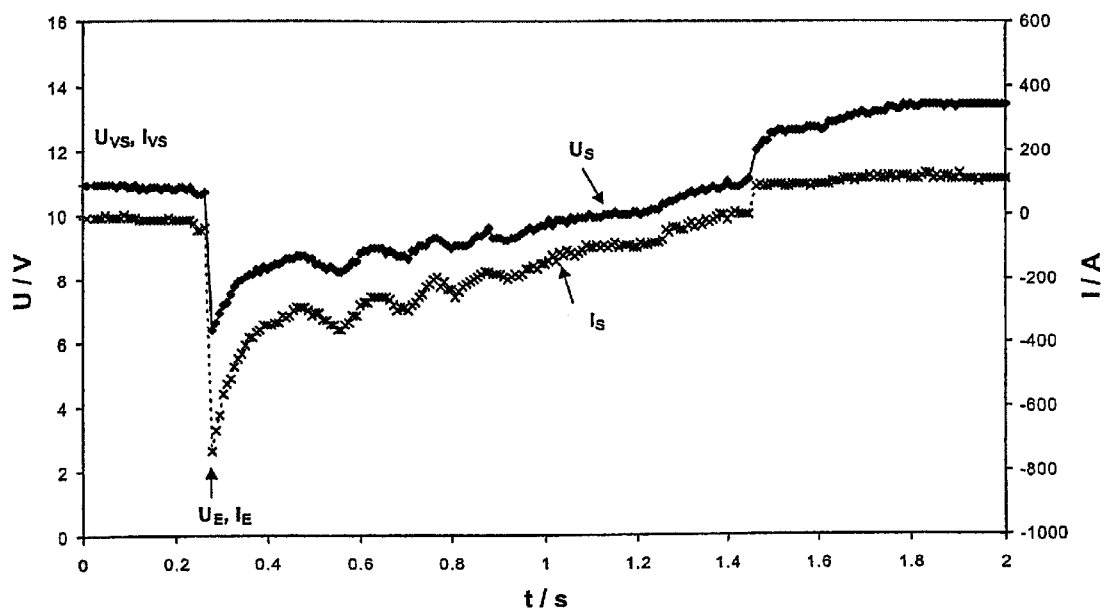
FIG. 1 shows characteristic curves for the current and voltage when a motor vehicle is started using a battery in good condition.

As can be seen from FIG. 1, when the starting procedure is initiated, the current has a momentary peak value and the voltage has a maximum dip. As the starting procedure progresses further, the internal combustion engine is set in motion by the starter, with the result that the current falls again in waves, corresponding to the compression and decompression of the cylinders, and the voltage recovers accordingly. If a minimum speed of the internal combustion engine is reached, it continues to run automatically.

Figure 2:
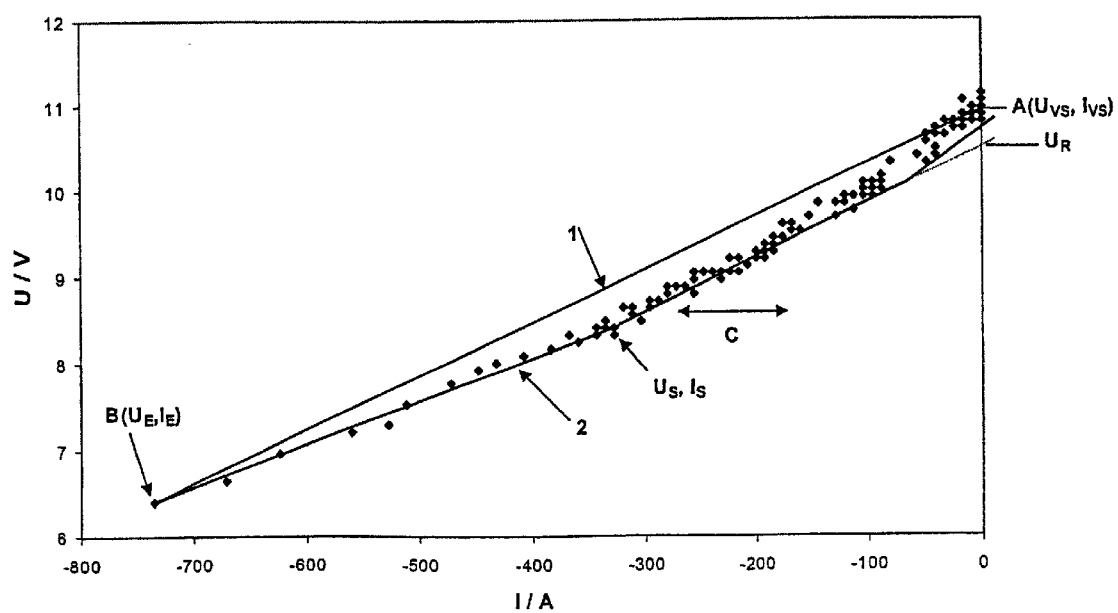
FIG. 2 shows the curve for the voltage as a function of the current, on the basis of the values from FIG. 1.

If, for a battery which has aged a little and whose response is plotted in FIG. 1, the voltage is plotted against the current as in FIG. 2, then a relatively linear curve is obtained, corresponding to curve 2. In FIG. 2, point A corresponds to the value pair ($U_{VS}$,$I_{VS}$), i.e., voltage and current before starting, where there is generally still a low level of loading by customary loads. The instant of this measurement is not particularly critical. A measurement can be taken directly before starting or else several seconds beforehand, for example, two seconds beforehand, if no heavy loads are turned on otherwise.

Point B in FIG. 2 shows the value pair ($U_E$,$I_E$), namely the voltage and current shortly after starting is begun. The goal is to select the instant of maximum current. It is usually sufficiently accurate to take a measurement no later than approximately 0.02 seconds after starting is begun, however. The gradient of the connecting line between points A and B, or the quotient of $U_{VS}$-$U_E$ and $I_E$-$I_{VS}$, is the turn-on internal resistance $R_E$.

In the course of the starting procedure, values of $U_S$ and $I_S$ measured at short intervals of time are plotted as points in curve 2 during the starting procedure. The measurement instants are 0.01 second apart, for example. In principle, the spacing, between the measurement instants needs to be selected such that the starting procedure has sufficient resolution, i.e., the temporal spacing may be between about 0.001 sec. and about 0.1 sec. It is merely necessary to ensure that there is a sufficient number of measured values, for example, about 100 measured values for a normal average starting duration of about 1 sec.

Figure 5:
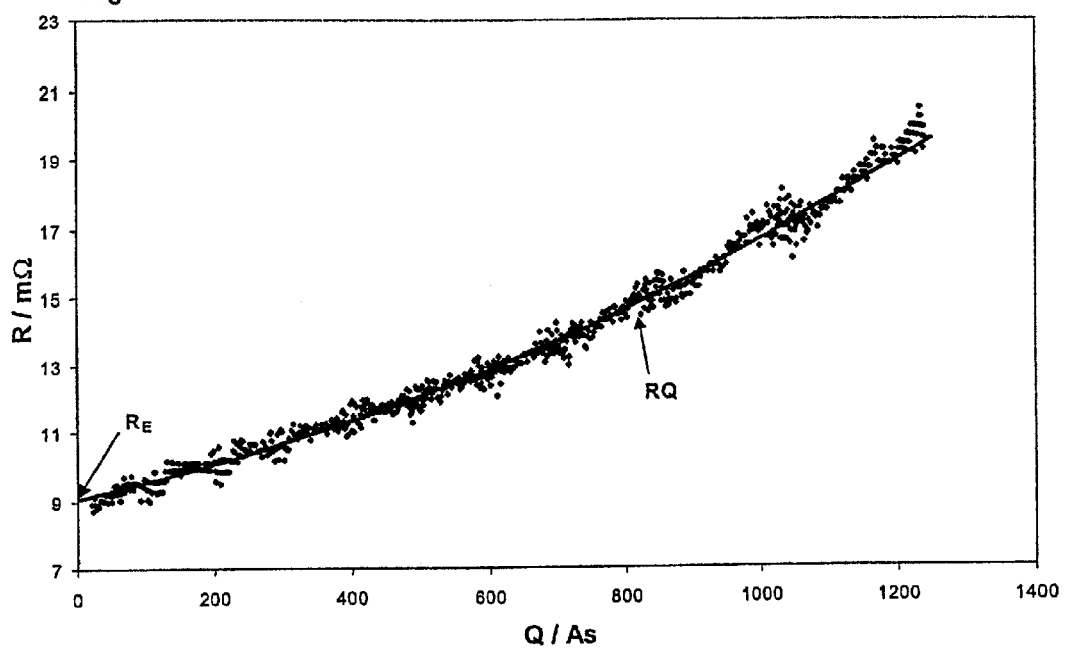
FIG. 5 shows the internal resistance of the storage battery as a function of the quantity of charge drawn during the starting procedure, in accordance with FIG. 3.

In FIG. 5, the internal resistance of the storage battery is plotted against the quantity of charge drawn from the storage battery for each measurement instant. According to the invention, the gradient of the resistance line as a function of the quantity of charge converted is used as a measure of aging. In the present example, in a range from 0 to approximately 1 second, the change in resistance per quantity of charge converted $\Delta RQ$, or the measure of aging, is largely independent of the determination instant.

If the measured values have a relatively large degree of scatter in comparison with the compensating curves, it is advantageous to include further operands when ascertaining the measure of aging.

Of particular interest in curve 2 of FIG. 2 is the range C, which is approximately parallel to line 1, that is, the range in which the gradient $R_S$ of curve 2 is approximately equivalent to the value $R_E$.

Thus, a voltage and current pair ($U_S$,$I_S$) is determined in the time range in which the gradients $R_E$ and $R_S$ are as near to the same size as possible, with $R_s$ being determined as the inclination of curve 2 using U I values at two respective instants, which are about 0.2 s apart, for example. The tangent to curve 2 in the range which is parallel to curve 1 intersects the voltage coordinate (I=O) at the equivalent no-load voltage $U_R$. This tangent is virtually the resistance line of the battery in the range relevant to starting.

Figure 3:
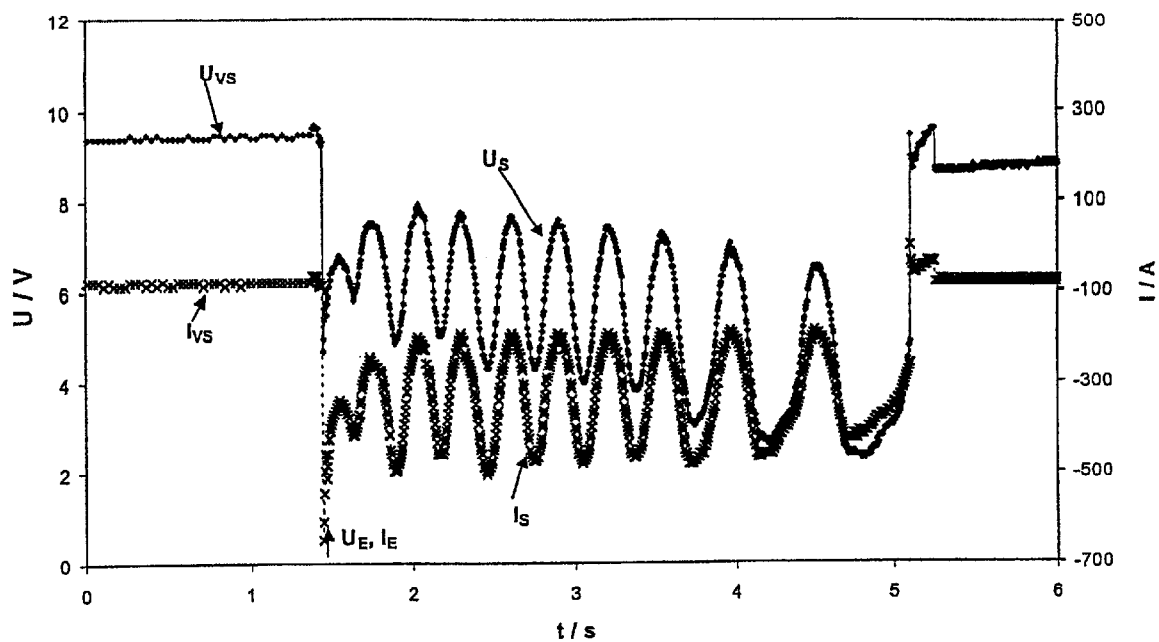
FIG. 3 shows the characteristic curves for the current and voltage during the starting procedure of a severely weakened battery for which starting is no longer successful.
Figure 4:
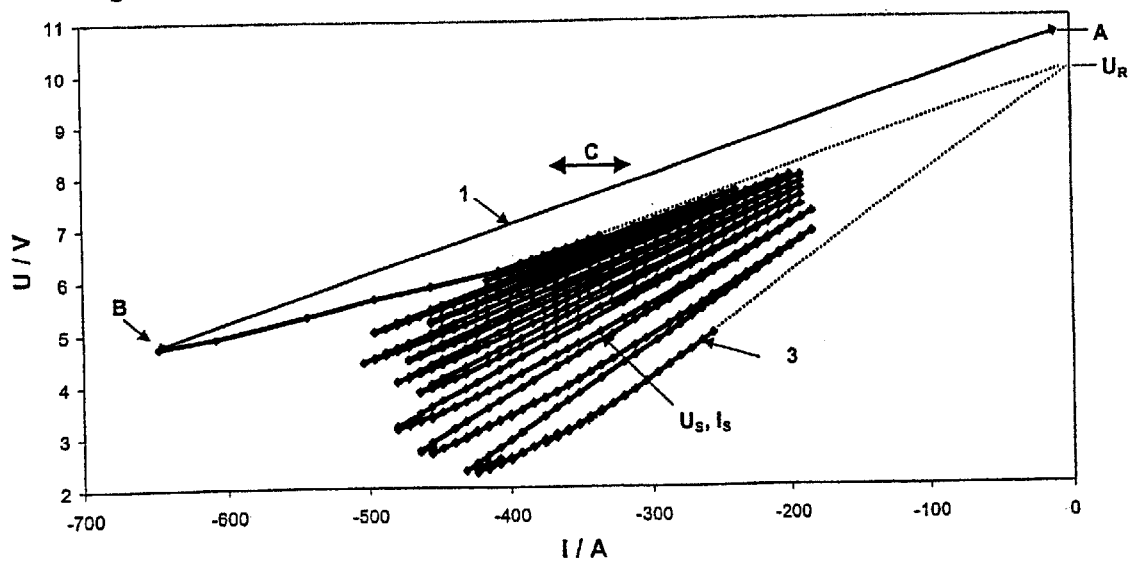
FIG. 4 shows the voltage plotted as a function of the current, as derived from FIG. 3.

If the same method is used with the current/voltage characteristic curve in FIG. 3, then the result in FIG. 4 is a representation of voltage as a function of current for a very severely weakened battery. It can be seen that the internal resistance, represented by the individual points in FIG. 4, rises.

If tangents are placed into the associated current/voltage values in this representation, then it is evident that the tangents fan out or that the gradient of the tangents, or the internal resistance, rises. In the case of the line denoted by 3 in FIG. 4, the internal resistance reaches a maximum. All the tangents have a common point of origin, which is approximately at $U_R$. This knowledge makes it possible to correct the scatter of the measured values.

The value $\Delta RQ$ and the turn-on resistance $R_E$ are stored in an arithmetical memory as a field as a function of the charge state or of the equivalent no-load voltage and the battery temperature, and are compared with already recorded values or typical standard values. Relatively large differences, such as a gradient $\Delta RQ>0.001$ m$\Omega$/As (ascertained for a customary starter battery with 60 Ah), indicate advanced battery aging or lack of charge. Whether this relates to battery aging or lack of charge is distinguished from the charge state. With a charge state of more than 40%, for example, there should be no starting problems at normal winter temperatures.

In the case of fresh batteries with a sufficiently high charge state, or in the case of high battery temperatures, the starting procedure usually takes place so quickly that evaluation is not possible. In such cases, evaluation is not necessary, however, and the gradient of the resistance line $\Delta RQ$ can be set equal to zero. As the battery starts to age, however, evaluation produces discrete values, which means that it is possible to react early enough by replacing the battery, for example. The deterioration in the battery's power. as determined in accordance with the invention, can be indicated to the driver if at prescribed limit value is exceeded, for example, or automatic consequences can be triggered, for example, in the charging technology, by aiming for a higher charge state to compensate for advancing aging. Such changes can, of course, be effected not only when a threshold value is reached, but also gradually, on the basis of ascertained mean values. Finally, an apparent sudden improvement in the battery can infer that it has been replaced, for example.

What is claimed is:

1. A method for determining the starting ability of a starter battery in a motor vehicle comprising:

measuring current and voltage of the storage battery before starting is begun;

measuring current and voltage of the storage battery shortly after starting is begun;

measuring current and voltage of the storage battery at predetermined intervals of time during starting;

calculating a resistance value and the quantity of charge drawn from the storage battery from current/voltage value pairs for each measurement; and determining a measure of availability of the storage battery during starting, based on the rate of rise in the resistance values, as a function of the quantity of charge drawn.

2. The method as defined in claim 1, wherein the voltage and current are measured before starting ($U_{VS}$,$I_{VS}$) and no later than about 0.02 sec. after starting is begun ($U_E$,$I_E$).

3. The method as defined in claim 1, wherein the time intervals between the voltage and current measurements are between about 0.001 and about 0.1 sec.

4. The method as defined in claim 1, wherein the time intervals between the voltage and current measurements are approximately 0.01 sec.

5. The method as defined in claim 1, wherein a voltage and current pair ($U_S$,$I_S$) is measured in a time range in which turn-on resistance $R_E$ and resistance $R_S=\Delta U_S/\Delta I_S$ are substantially the same, and $R_S$ is determined as the gradient of a current/voltage line at two respective instants which are separated by a relatively long measurement period to determine an equivalent no-load voltage $U_R$.

6. The method as defined in claim 5, wherein the measurement period is approximately 0.2 sec.

7. The method as defined in claim 1, wherein a charge state of the battery is determined from no-load voltage before starting.

8. The method as defined in claim 1, wherein a gradient $\Delta RQ$ of internal resistance as a function of quantity of charge drawn and turn-on resistance $R_E$ are stored in an arithmetical memory and compared with prerecorded values or preselected normal values.

9. A method for determining the starting ability of a starter battery in a motor vehicle comprising:

measuring current and voltage of the storage battery before starting is begun;

measuring current and voltage of the storage battery shortly after starting is begun;

measuring current and voltage of the storage battery at predetermined intervals of time during starting;

calculating a resistance value and the quantity of charge drawn from the storage battery from current/voltage value pairs for each measurement;

measuring a voltage and current pair ($U_S$,$I_S$) in a time range in which turn-on resistance $R_E$ and resistance $R_S=\Delta U_S/\Delta I_S$ are substantially the same, and determining $R_S$ as the gradient of a current/voltage line at two respective instants which are separated by a relatively long measurement period to determine an equivalent no-load voltage $U_R$ for determining the charge state of the storage battery;

storing a gradient $\Delta RQ$ of internal resistance as a function of quantity of charge drawn and turn-on resistance $R_E$ in an arithmetical memory and comparing the gradient with already recorded values or preselected normal values;

determining a measure of availability of the storage battery during starting, based on the rate of rise in the resistance values as a function of the quantity of charge drawn.

* * * * *